United States Patent [19]
Pascucci

[11] Patent Number: 5,914,901
[45] Date of Patent: Jun. 22, 1999

[54] INTEGRATED CIRCUIT FOR GENERATING INITIALIZATION SIGNALS FOR MEMORY CELL SENSING CIRCUITS

[75] Inventor: Luigi Pascucci, Sesto San Giovanni, Italy

[73] Assignee: SGS-Thomson Microelectronics S.r.l., Agrate Brianza, Italy

[21] Appl. No.: 08/866,283

[22] Filed: May 30, 1997

[51] Int. Cl.[6] ........................................... G11C 7/00
[52] U.S. Cl. .................... 365/191; 365/203; 365/205; 365/185.25
[58] Field of Search ......................... 365/191, 185.25, 365/205, 203; 327/142

[56] References Cited

U.S. PATENT DOCUMENTS

| | | | |
|---|---|---|---|
| 5,381,369 | 1/1995 | Kikuchi et al. | 365/185.01 |
| 5,517,451 | 5/1996 | Okuzawa | 365/203 |
| 5,619,466 | 4/1997 | McClure | 365/207 |

*Primary Examiner*—David Nelms
*Assistant Examiner*—Hoai V. Ho
*Attorney, Agent, or Firm*—Wolf, Greenfield & Sacks, P.C.

[57] ABSTRACT

A circuit for generating initialization signals for a memory cell sensing circuit is disclosed. The sensing circuit includes an initialization circuit activated by the initialization signals during an initial phase of a sensing operation of the memory cells for initializing the sensing circuit. The initialization signals have a time duration that varies according to the conductivity of the memory cells, so that the duration of the initial phase of the sensing operation depends on the conductivity of the memory cells to be read.

46 Claims, 7 Drawing Sheets

INTEGRATED CIRCUIT FOR GENERATING INITIALIZATION SIGNALS FOR MEMORY CELL SENSING CIRCUITS

FIELD OF THE INVENTION

The present invention relates to an integrated circuit for generating initialization signals for memory cell sensing circuits.

BACKGROUND OF THE INVENTION

It is known that semiconductor memory devices, such as for example non-volatile memories of the ROM, EPROM, EEPROM and Flash EEPROM families, comprise a matrix of memory cells arranged in rows ("word lines") and columns ("bit lines"), and selection circuits of the rows and columns. For reading the memory sensing circuit are provided ("sense amplifiers") adapted to detect the programming state of those memory cells belonging to the selected rows and columns.

The read operation normally provides an initialization phase during which the potentials of the selected rows and columns reach prescribed initial levels, and the sensing circuits are initialized.

Only after said phase the evaluation phase of the data stored in the selected memory cells starts.

Typically, in the initialization phase the potential of the selected rows is brought to a prescribed value, e.g. that of the supply voltage of the integrated circuit; at the same time, the potential of the selected columns is brought to an initial prescribed level too. In the case of the sense amplifier having the known comparison architecture, providing for comparing the current sunk by the addressed memory cells with reference memory cells, the potentials of the columns of memory cells, the columns of reference memory cells and the internal potentials of the sensing circuits are equalized.

In the following phase of evaluation of the data, the equalization of the potentials of the matrix columns and the reference columns and of the internal nodes of the sensing circuits ceases, and such potentials evolve according to the programming state of the addressed cells.

In order to guarantee the correct working of the memory, it is important to accurately determine the duration of the initialization phase, i.e. the time instant at which the initialization phase ends and the data evaluation phase starts.

A problem in the design phase is that the optimum time duration of the initialization phase cannot be considered an absolute constant, being actually a function of the parameters of the memory cells, of the supply voltage, of the working temperature, and other variables, such as the sensibility of the sense amplifiers.

For example, in a memory device wherein the memory cells are characterized by a conductivity rather low it is necessary that the initialization phase has a longer duration. The same holds true in the case that the memory device is operated at a low supply voltage; when the supply voltage is so low that a reliable reading of the data cannot be assured, the data evaluation phase should not even be started.

The choice of a duration too small of the initialization phase thus has the consequence that, in certain situations, the data provided at the output of the memory are not correct.

However, choosing an initialization phase with too long a duration could cause that the prescription regarding the memory access time is not complied.

In other words, an initialization phase with a constant duration, independently of the working conditions of the memory and other conditions, poses problems.

The known timing circuits used to generate time delays allow in general to have time delays which are not correlated to the electric characteristics of the memory cells to be read and their operating conditions.

SUMMARY OF THE INVENTION

In view of the described state of the art, it is an object of the present invention that of providing a circuit for generating initialization signals for sensing circuits of the memory cells which solves the problems previously described.

According to the present invention, such an object is achieved by means of a circuit for generating initialization signals for a memory cell sensing circuit, said sensing circuit comprising initialization means activatable by said initialization signals during an initial phase of a sensing operation of the memory cells for initializing the sensing circuit, characterized in that said initialization signals have a time duration variable according to the conductivity of said memory cells, so that the duration of said initial phase of the sensing operation depends on the conductivity of the memory cells to be read.

The circuit according to the present invention allows to generate initialization signals for the memory cell sensing circuits having a duration variable according to the conductivity of the memory cells to be read. In this way, the instant at which the evaluation phase of the data stored in the memory cells is not fixed, but varies according to the electric characteristics of the memory cells, the supply voltage, the operating temperature, etc.

Preferably, the duration of said initial phase of the operation is extended indefinitely when the conductivity of the memory cells is lower than a minimum prescribed value, below which the data reading could not be reliable.

BRIEF DESCRIPTION OF THE DRAWINGS

These and other features and advantages of the present invention will be made more evident by the following detailed description of some embodiments thereof, illustrated as non limiting examples in the annexed drawings, wherein.

DETAILED DESCRIPTION OF THE PREFERRED EMBODIMENTS

Figure 1:
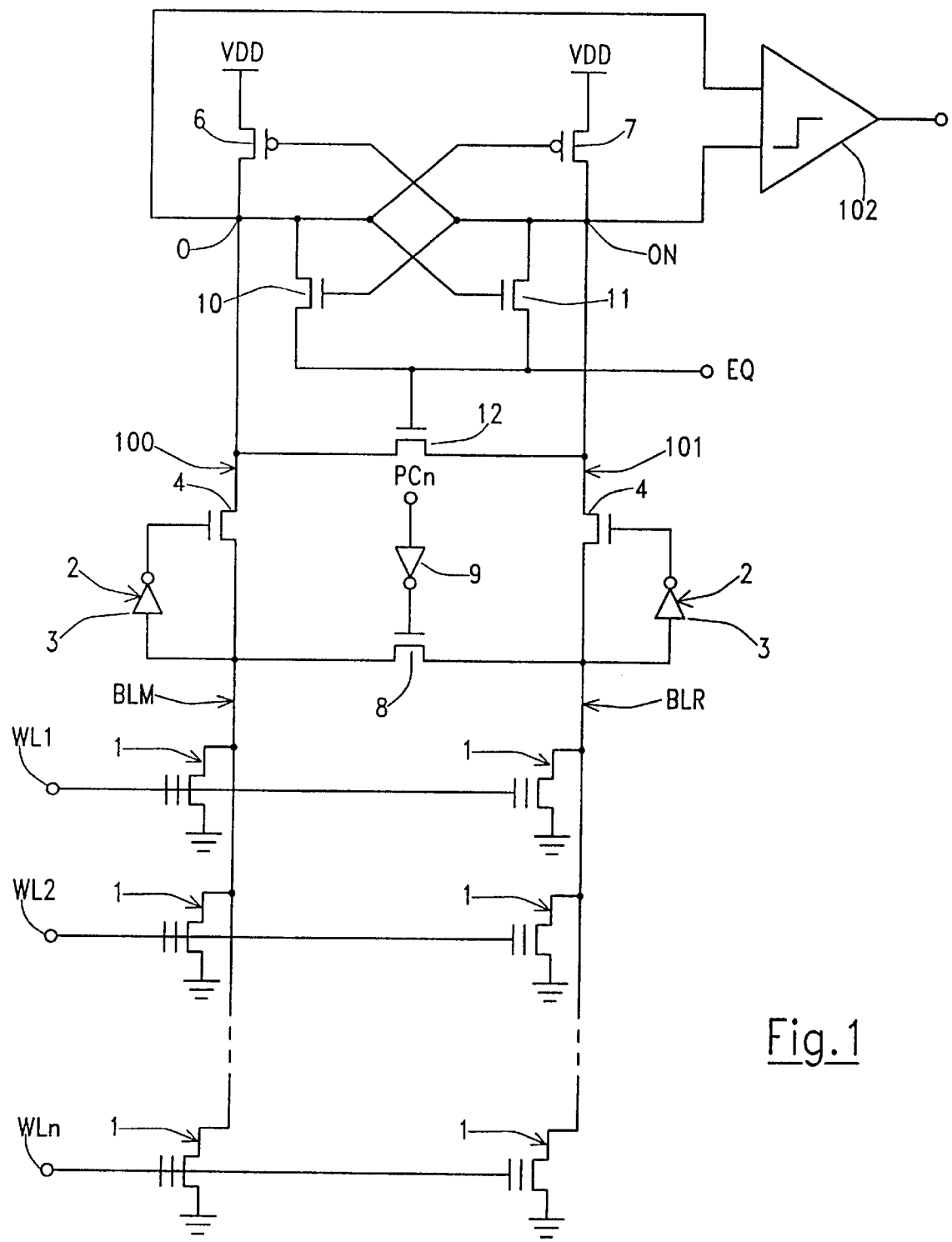
FIG. 1 is a circuit diagram of a sensing circuit provided in a memory device for reading memory cells of the same.

With reference to the drawings, in FIG. 1 there is shown a sensing circuit ("sense amplifier") for reading memory cells belonging to a memory matrix arranged conventionally in rows (word lines) and columns (bit lines). The sensing circuit has a known structure, comprising a first circuit branch 100 connectable to a column of cells BLM of the memory matrix, said column containing the memory cell to be read and being selected by means of known selection circuits (not shown), and a second, reference circuit branch 101 connected to a column of reference memory cells BLR.

The cells of the memory matrix and the reference cells are for example formed by stacked-gate MOS transistors 1, comprising an electrically insulated gate in which electric charges can be trapped, so as to modify the threshold voltage of the transistor. Each transistor is connected in parallel to the other transistors of the same column, having the drain connected to the column and the source to ground. The control gate of each transistor is connected to a respective row WL1, WL2, . . . , WLn of the memory matrix; the row is selected by means of known selection circuit (not shown).

Conventionally, a memory cell drain voltage regulator 2 is connected in series to the matrix column BLM and the reference column BLR, which allows for limiting the maximum voltage of the cells' drain to prevent spurious programming of the cells. Each regulator 2 comprises in a per-se known way an inverter 3 with input connected to the respective column (i.e., to the drain of the cells 1) and output driving the gate of an N-channel MOSFET 4 (generally of the type with low threshold voltage) connected in series to the column.

In each branch 100, 101, in series to the respective regulator 2 there is connected a respective P-channel MOSFET 6, 7 with source connected to a voltage supply VDD of the memory device and drain connected to the drain of the respective MOSFET 4. The gate of MOSFET 6 in branch 100 is connected to the drain of MOSFET 7 in branch 101, and the gate of MOSFET 7 is connected to the drain of MOSFET 6, so as to form a portion of a latch circuit for storing the datum of the addressed memory cell read by the sensing circuit. The sensing circuit further comprises two N-channel MOSFETs 10, 11: MOSFET 10 has the drain connected to the drain of MOSFET 6, source connected to an equalization signal EQ and gate connected to the drain of MOSFET 7; MOSFET 11 has the drain connected to the drain of MOSFET 7, source connected to signal EQ and gate connected to the drain of MOSFET 6. MOSFETs 10 and 11 form the second portion of the latch circuit.

The sensing circuit also comprises an N-channel MOSFET 8 connected between column BLM and column BLR, and controlled through an inverter 9 by a column pre-charge signal PCn. Signal EQ also controls an N-channel MOSFET 12 inserted between the drains of MOSFETs 6 and 7, for equalizing the potentials of two output signals O and ON of the sensing circuit (one of which is the logic complement of the other). The two output signals O and ON supply a comparator 102, the output thereof provides a logic signal whose level corresponds to the datum contained in the read memory cell.

Signal PCn is a pre-charge signal which is activated during the initial phase of each read operation, in the time interval between which a row of the memory matrix is selected, to turn MOSFET 8 on so as to equalize the potentials of columns BLM and BLR during the charge thereof. Signal EQ is similarly activated during the initial phase of a read operation so as to turn MOSFET 12 on, to equalize the drain potentials of MOSFETs 6 and 7. Signal PCn has a prescribed duration, after which it is deactivated to turn MOSFET 8 off and let the potentials of the two columns BLM and BLR evolve according to the programming state of the respective cell belonging to the selected row. Signal EQ normally remains activated also after signal PCn has been deactivated, and is deactivated when the potentials of columns BLM and BLR have substantially reached a steady-state value. When signal EQ returns to the low logic level, it turns MOSFET 12 off so that the potentials of the output signals O and ON can evolve independently. Additionally, signal EQ provides a ground to the sources of MOSFETs 10 and 11: there is thus formed a latch structure wherein it possible to store the datum contained in the addressed memory cell.

Thus, reading of the datum contained in the memory cell by the sensing circuit actually starts only after signals PCn and EQ are returned to the high and low logic levels, respectively.

It is important that the time interval during which signal EQ remains activated after signal PCn has returned to the "1" logic level has a duration sufficient to assure that the potentials of the columns BLM and BLR have varied with respect to the equalized condition according to the currents sunk by the respective memory selected cells. It is to be noted that the columns have capacities which are to be charged or discharged by the current sunk by the cell. The lower the current sunk by the cell to be read, the higher the time necessary to charge or discharge said capacity. Thus, in order to guarantee a correct working of the sensing circuit in different operating conditions (voltage supply, operating temperature, electric characteristics of the cells) it is necessary that the duration of signal EQ is not a constant, but keeps account of the current sunk by the cells in the specific operating condition.

Figure 2:
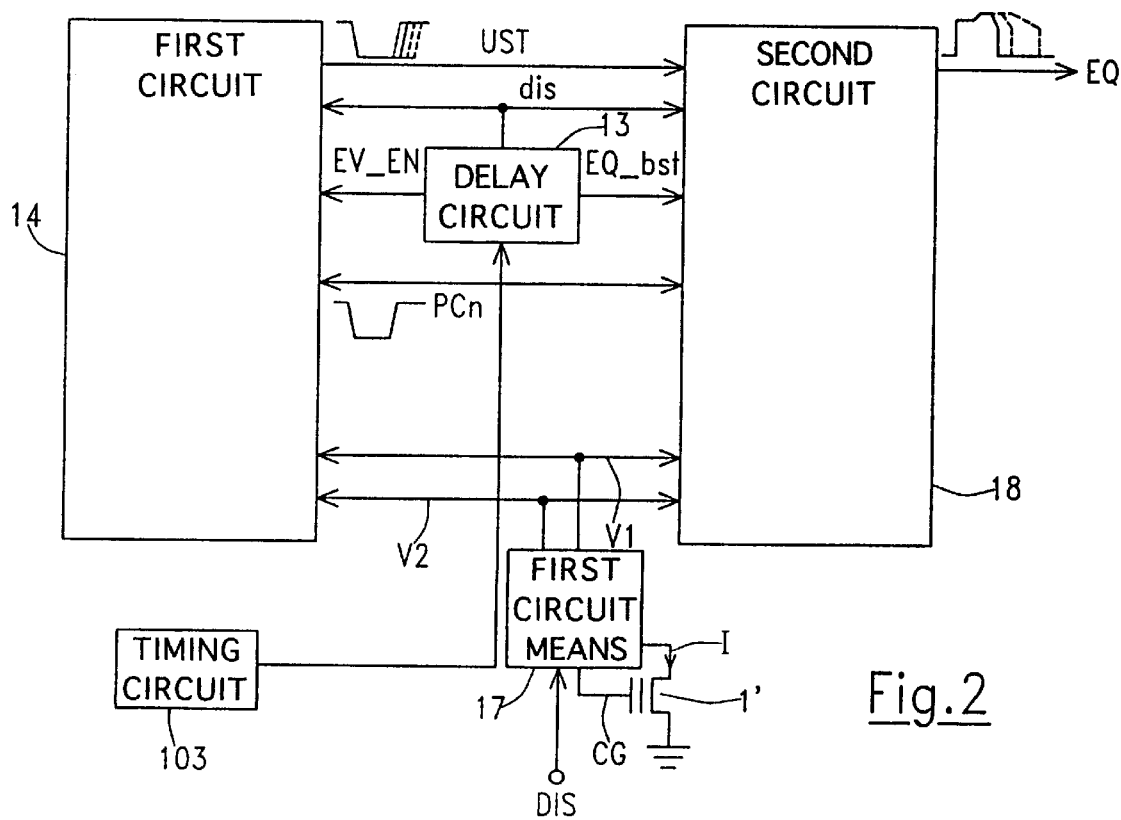
FIG. 2 is a block diagram of the circuit for generating timing circuit according to the present invention.

In FIG. 2 a block diagram of a circuit according to the present invention is shown. The circuit generates timing signals having variable duration depending on the characteristics of the cells. Signal PCn, generated by a circuit block 103 when the memory is addressed for reading the content thereof, supplies a block 13, a block 14 and a block 18. Block 13 generates control signals EV__EN and EQ__bst. Signal EV__EN is supplied to block 14, while signal EQ__bst is supplied to block 18. Block 14 and block 18 are both supplied with two voltages V1 and V2 generated by a block 17. Voltages V1 and V2 are analog voltages having values depending on a current I sunk by a transistor 1' identical to those forming the memory cells 1, biased by a gate voltage CG so as to simulate the biasing conditions of the selected memory cells; transistor 1' is in a sense a sample memory cell. In particular, voltage V1 is strictly correlated to current I, while voltage V2 has a lesser dependence on current I.

Block 14 generates at its output a signal UST which corresponds to signal PCn, but having a duration variable (higher than that of signal PCn) according to the current I sunk by the sample memory cell 1'. More precisely, with reference to FIG. 11, the activation edge of PCn determines the sudden activation of UST, which is deactivated after a time interval variable according to current I, which is the minimum sufficient to guarantee that after the deactivation of PCn the sensing circuit can correctly read the datum. Signal UST supplies block 18, whose output is signal EQ.

Also signal EQ has a duration variable according to current I sunk by the sample cell. Additionally, signal EQ has a voltage value (in the high logic state) preferably higher than the supply voltage, so as to suitably equalize nodes O and ON, and has a falling edge that, at least partially, has a slope depending on current I sunk by the sample cell. This is important because if the falling edge of signal EQ had a steep slope it could cause, due to capacitive a couplings between the nodes of the sensing circuit, an unbalancing of the latch structure of the sensing circuit which can cause an incorrect reading. It is thus important that the falling edge of signal EQ is less steep the lower the current sunk by the addressed memory cells, because in this case the signals produced at the nodes of the sensing circuit have a lower amplitude and can easily be disturbed by capacitive couplings. The slope of the falling edge of signal EQ is important until at the nodes of the sensing circuit a sufficient differential signal has developed which can be surely detected; from then on the slope can be made steeper.

The variable slope of signal EQ provides in a modulation of the sensitivity of the sensing circuit. Such a modulation can be obtained, as will be described in later on, by reproducing in block, 18 the circuit structure of the sensing amplifier of FIG. 1. Thus, according to the present invention, the sensitivity of the sensing circuit can be varied according to the conductivity characteristics of the memory cells, assuring at the same time the equalization. In other words, the read operation is performed modulating the sensitivity of the sensing circuit according to the conductivity of the cells, the supply voltage value, the temperature, and in general the statistic variations of the technological parameters.

The detailed structure of the blocks of the circuit of FIG. 2 will be now described.

Figure 3:
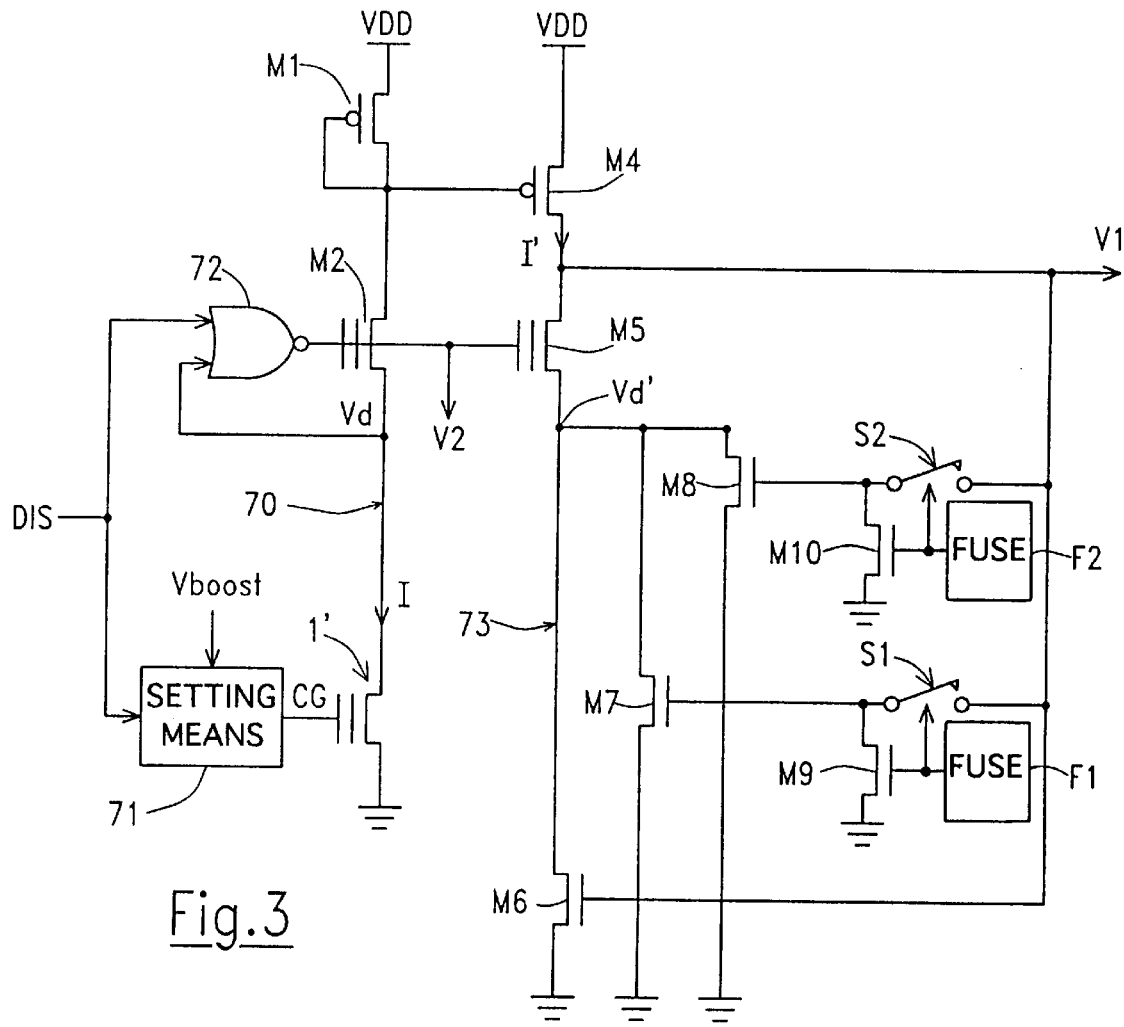
FIG. 3 is a circuit diagram of a first embodiment of a first block of the circuit of FIG. 2.

In FIG. 3 a circuit diagram of block 17 is shown. The circuit comprises a current mirror comprising a first circuit branch 70 wherein there are connected in series between the voltage supply VDD and the reference voltage a P-channel MOSFET M1 with gate tied to drain, an N-channel MOSFET M2, preferably of the low threshold voltage type (so-called "native") and transistor 1' already shown in FIG. 2, identical to the memory cells 1. The gate voltage CG for transistor 1' is supplied by a block 71 supplied by a voltage Vboost which, in memory devices supplied with a 5 V voltage, coincides with the voltage supply VDD of the memory device, while in memory devices supplied with 3 V or less voltages can be a voltage higher than the supply voltage, generated internally to the chip, which is used to drive the rows WL1–WLn to guarantee faster reading of the device. A circuit for regulating the drain voltage of transistor 1' is provided, similar to the circuits 2 in the sensing circuit of FIG. 1, comprising a NOR logic gate 72 which receives at an input a signal Vd corresponding to the drain potential of 1' and, at the other input, a disable signal DIS which also supplies block 71. The output of NOR gate 72 controls the gate of MOSFET M2.

The current mirror further comprises a second circuit branch 73 comprising, serially connected between the supply voltage VDD and the reference voltage, a P-channel MOSFET M4 with gate connected to the drain of M1, an N-channel MOSFET M5 identical to MOSFET M2 in branch 70 and having gate tied to the gate of M2, and an N-channel MOSFET M6. The gate of M65 is connected to the drain of M4. In parallel to M6 there are additional provided an N-channel MOSFET M7 and an N-channel MOSFET M8. M7 has gate connected through a switch S1 to the drain of M4; switch S1 is controlled by a programmable memory element (fuse) F1 which controls an N-channel MOSFET M9 inserted between the gate of M7 and the reference voltage. Similarly, M8 has gate tied to the drain of M4 through a switch S2 controlled by a programmable memory element (fuse) F2 which also controls an N-channel MOSFET M10 inserted between the gate of M8 and the reference voltage.

The drain potential of M4 forms voltage V1, while the gate potential of M2 and M5 forms voltage V2.

Figure 4:
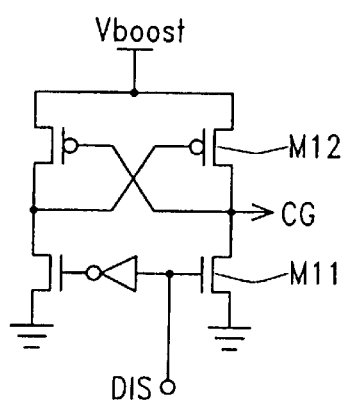
FIG. 4 is a circuit diagram of a sub-block of the block shown in FIG. 3

Block 71 has for example the structure shown in FIG. 4; when signal DIS is at the high logic level, an N-channel MOSFET M11 is on; voltage CG, taken from the drain of M11, is thus brought to ground and transistor 1' is off. Block 17 is thus disabled. When signal DIS is at the low logic level, M11 is off and a P-channel transistor M12 connected in series to M11 between voltage Vboost and ground is on; voltage CG is thus brought toward voltage Vboost.

The operation of the circuit of FIG. 3 will be now described in detail.

When signal DIS is at the low logic level ("0"), NOR gate 72 is enabled (the output thereof depending on the input Vd), as well as block 71. This latter supplies the control gate of transistor 1' a voltage CG substantially equal to voltage Vboost, which is equal to supply voltage VDD or higher; such a voltage is sufficient to cause transistor, 1' to turn on, so that 1' sinks a current I. The drain potential of 1' is regulated by the regulation circuit comprising MOSFET M2 and the NOR gate 72: the potential Vd which drives the gate of an N-channel MOSFET of the NOR gate 72 settles to a value approximately corresponding to the threshold voltage of an N-channel MOSFET, substantially independent of the value of current I sunk by transistor 1'; current I thus is fixed by the value of voltage CG. Signal V2 settles to a value equal to Vd plus the threshold voltage of M2, substantially independent of the value of current I sunk by 1'.

Through MOSFET M4 in branch 73 of the current mirror, due to the link between the gate of M4 to the gate of M1, a current I' will flow equal to:

$$I'=I*K4/K1$$

where K1 and K2 are coefficients depending on the aspect ratios of MOSFETs M1 and M4, respectively. Current I' is thus equal (apart from a proportionality factor depending on the ratio between the aspect ratios of M4 and M2) to current I flowing through branch 70. The equation above holds true until MOSFET M4 is in saturation. Assuming that programmable elements F1 and F2 have not been programmed, i.e. switches S1 and S2 are open, the whole current I' flows through MOSFET M6. The latter is biased to have, on the drain, a voltage substantially equal to voltage Vd on the drain of transistor 1' (due to the fact that MOSFET M5 is controlled by the same gate voltage as M2) and voltage V1 on the gate. The drain voltage of M6 is thus substantially constant, independent of the current flowing through the same, and is approximately equal to a threshold voltage of an N-channel MOSFET; thus, the gate voltage of M6 should be such as to allow MOSFET M6 to sustain the current I' forced by MOSFET M4. Assuming that M6 works in a linear region, the current I' is given by:

$$I'=K6*(V_{GS6}-VT6)*V_{DS6}-V_{DS6}^2/2)$$

and since $V_{GS6}=V1$, $I'=I*K1/K4$, it is:

$$V1=(K4/(K1*K6))*(1/V_{DS6})*I+V_{DS6}/2+VT6$$

i.e., since $V_{DS6}$ is substantially constant and equal to the threshold voltage of an N-channel MOSFET, V1 is a linear function of I, with a proportionality factor determined by the ratio K4/(K1*K6). When I increases, for example in consequence to an increase of the gate voltage of transistor 1' (because the voltage supply VDD increases, or because voltage Vboost increases), voltage V1 increases consequently. This holds true also in the case the where increase of I is due to a higher conductivity of the memory cells 1, and thus of transistor 1', in consequence of variations of the electrical parameters of the memory cells (process variations).

Additionally, it is apparent that the dependence of V1 on I can be varied by changing the dimensional aspects of MOSFETs M1 and M4 (an increase of K1 with respect to K4 causes the slope of the straight line V1-I to increase), or connecting in parallel to MOSFET M6 MOSFETs M7 and M8, programming fuses F1 and F2. In this latter case, current I' is distributed among MOSFETs M6, M7 and M8. It is thus possible to have several voltage levels of V1, that can be controlled from outside the memory device. In this way it is possible to vary the modulation degree of the current I, to obtain time durations and slopes of the falling edge of signal EQ variable according to I in the more suitable way. Fuses F1, F2, allowing for modulating voltage V1, make it possible to set several sensing speeds: the lower the number of transistors by which current I' is shared, the higher V1 and consequently the higher the sensing speed.

Figure 5:
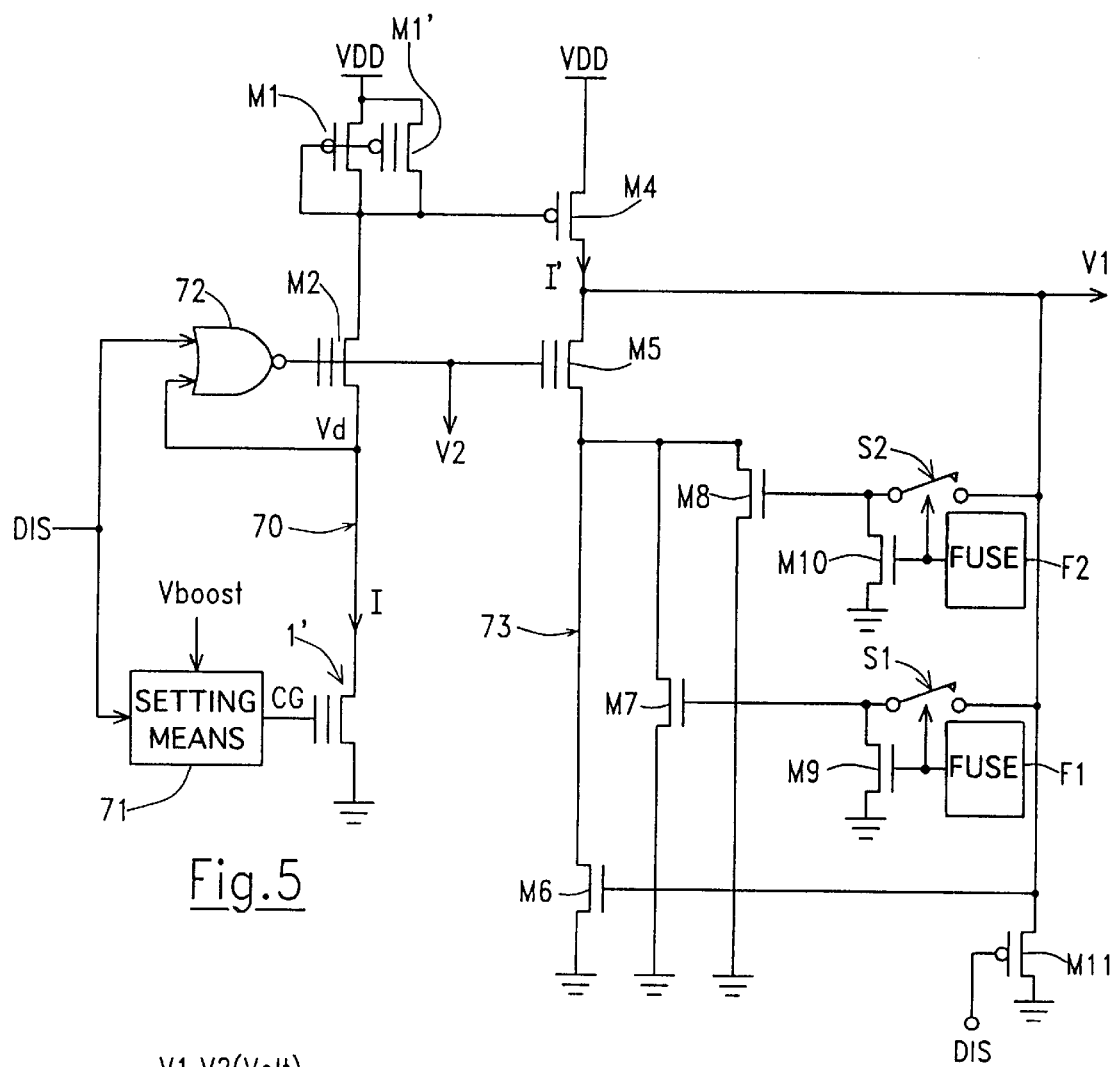
FIG. 5 is a circuit diagram of a second embodiment of the first block of the circuit of FIG. 2.

FIG. 5 shows a second embodiment of block 17 in FIG. 2. In this embodiment the circuit comprises, in addition to the elements already described in connection with FIG. 3, a P-channel MOSFET M1' with a threshold voltage higher (in absolute value) than M1 and connected in parallel to the latter. MOSFET M1', which is turned on when the drain voltage of M1 falls sufficiently in consequence of a large current I, allows for limiting current I' which is mirrored into branch 73, and consequently prevents voltage V1 from taking too high a value, to which value would correspond an excessive speed of the pre-charge phase and an excessive steeping of the falling edge of signal EQ, as will be better described later on. The circuit further comprises a P-channel MOSFET M11, preferably with high threshold voltage (in absolute value), having source connected to V1, drain connected to ground and gate controlled by signal DIS; M11 has substantially the same function as transistor M1', and can be used in alternative to or in combination with the latter for an increased efficiency.

Figure 6:
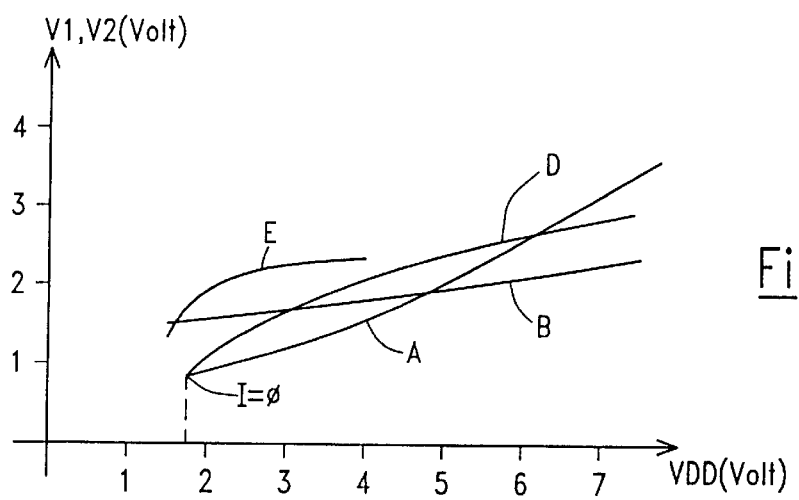
FIG. 6 shows the dependence of signals generated by the circuits of FIGS. 3 and 5 on the supply voltage.

FIG. 6 shows the dependence of voltages V1 and V2 on the supply voltage VDD; in particular, curve A refers to voltage V1 in the circuit of FIG. 3 (assuming that Vboost= VDD), curve D refers to voltage V1 in the circuit of FIG. 5; curve B relates to voltage V2 in the circuits of FIGS. 3 or 5. Curve E is similar to curve C, but in the case Vboost is higher than VDD. These curves show how it is possible to generate and successively modify the voltages generated by block 17, so as to perform sensing in the most suitable way.

Figure 7:
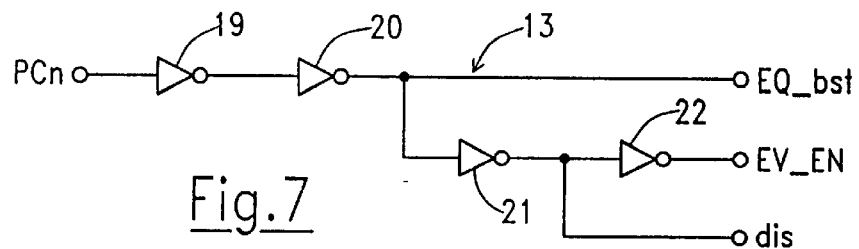
FIG. 7 is a circuit diagram of a second block of the circuit of FIG. 2.

FIG. 7 shows the circuit diagram of block 13 of the circuit shown in FIG. 2. Signal PCn drives two inverters 19, 20 connected in series whose output forms signal EQ_bst. Signal EQ_bst drives two inverters 21, 22 connected in series whose output forms signal EV_EN. The output of inverter 21 also forms a disable signal dis supplying blocks 14 and 18 in FIG. 2. Signals EQ_bst and EV_EN thus are identical to signal PCn, simply delayed, while signal dis is the logic complement (slightly delayed) of signal PCn.

Figure 8:
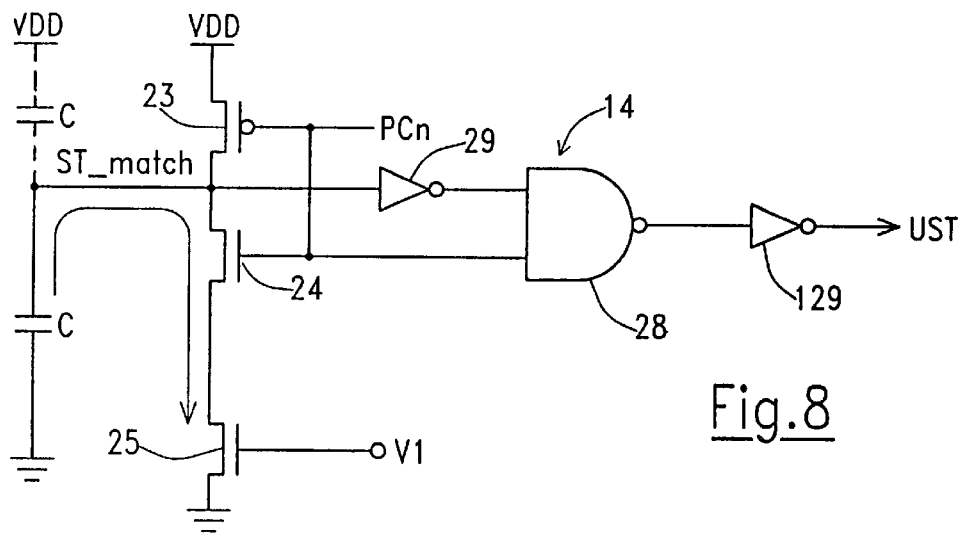
FIG. 8 is a circuit diagram of a first embodiment of a third block of the circuit of FIG. 2.

FIG. 8 is a circuit diagram of a first embodiment of block 14 of the circuit in FIG. 2. The circuit comprises a capacitor C with one plate connected to ground and the other plate connected to the drain of a P-channel MOSFET 23 having source connected to VDD and gate driven by PCn. In series to the drain of MOSFET 23 there is connected an N-channel MOSFET 24 also controlled by signal PCn, and to the source of MOSFET 24 there is connected an N-channel MOSFET 25 with source connected to ground and controlled by voltage V1. Signal PCn also supplies an input of a NAND gate 28 whose second input is supplied, through an inverter 29, with a signal ST_match forming the drain potential of MOSFET 23. The output of NAND gate 28 supplies an inverter 129 whose output forms signal UST.

In this embodiment (the simplest among the embodiments which will be herein described) block 14 does not make use of voltage V2 and signal dis generated by block 14.

FIG. 8 also shows a possible alternative embodiment of the circuit, in which capacitor C has one plate connected to VDD instead of to ground.

Figure 9:
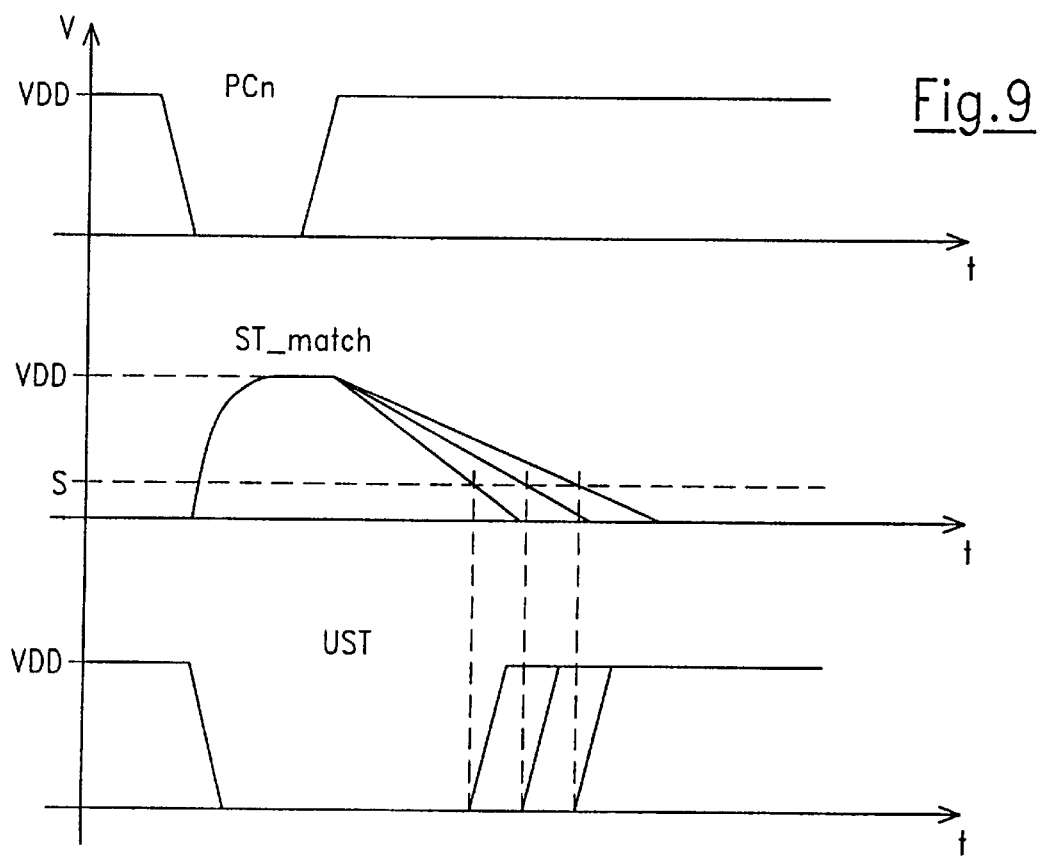
FIG. 9 shows the time evolution of some signals of the circuit of FIG. 8.

The operation of the circuit of FIG. 8 will be now explained making reference to the waveforms depicted in FIG. 9. When at the beginning of a read operation of the memory device signal PCn (normally at the high logic level) is activated switching it to the low logic level, MOSFET 23 turns on while MOSFET 24 turns off. Signal UST switches to the low logic level. MOSFET 23 charges capacitor C, and signal ST_match rises exponentially to VDD as in a conventional charge of a capacitor through a resistive voltage source. When signal PCn returns to the high logic level, MOSFET 23 turns off and MOSFET 24 turns on. Capacitor C discharges through MOSFET 25. Such a discharge takes place at a constant current with a value depending on the drive voltage of MOSFET 25, i.e. voltage V1 that, as previously described, has a value depending in a substantially linear way on current I sunk by the sample memory cell 1'.

Thus, the discharge time of capacitor C varies linearly according to the characteristics of the sample memory cell 1', and hence, the characteristics of memory cells 1, namely, the conductivity of the memory cells 1 in the given operating conditions (voltage supply, working temperature and so on).

When signal ST_match falls below the trigger level S of inverter 29, NAND gate 28 switches and signal UST switches to the high logic level. In this way, the duration of signal UST is not fixed, but varies according to the characteristics of the memory cells 1.

If current I sunk by the sample memory cell 1' is very low, voltage V1 is consequently low (FIG. 6). When voltage V1 is lower than the threshold voltage of MOSFET 25 (e.g. in the case of I=0), the discharge of capacitor C cannot take place and signal UST remains at the low logic level. It is thus possible to properly modulate the duration of the pre-charge phase and of the following phase in which the potentials of the bit lines BLM, BLR, no longer short-circuited, evolve, before the phase of sensing the datum (deactivation of signal EQ).

Figure 10:
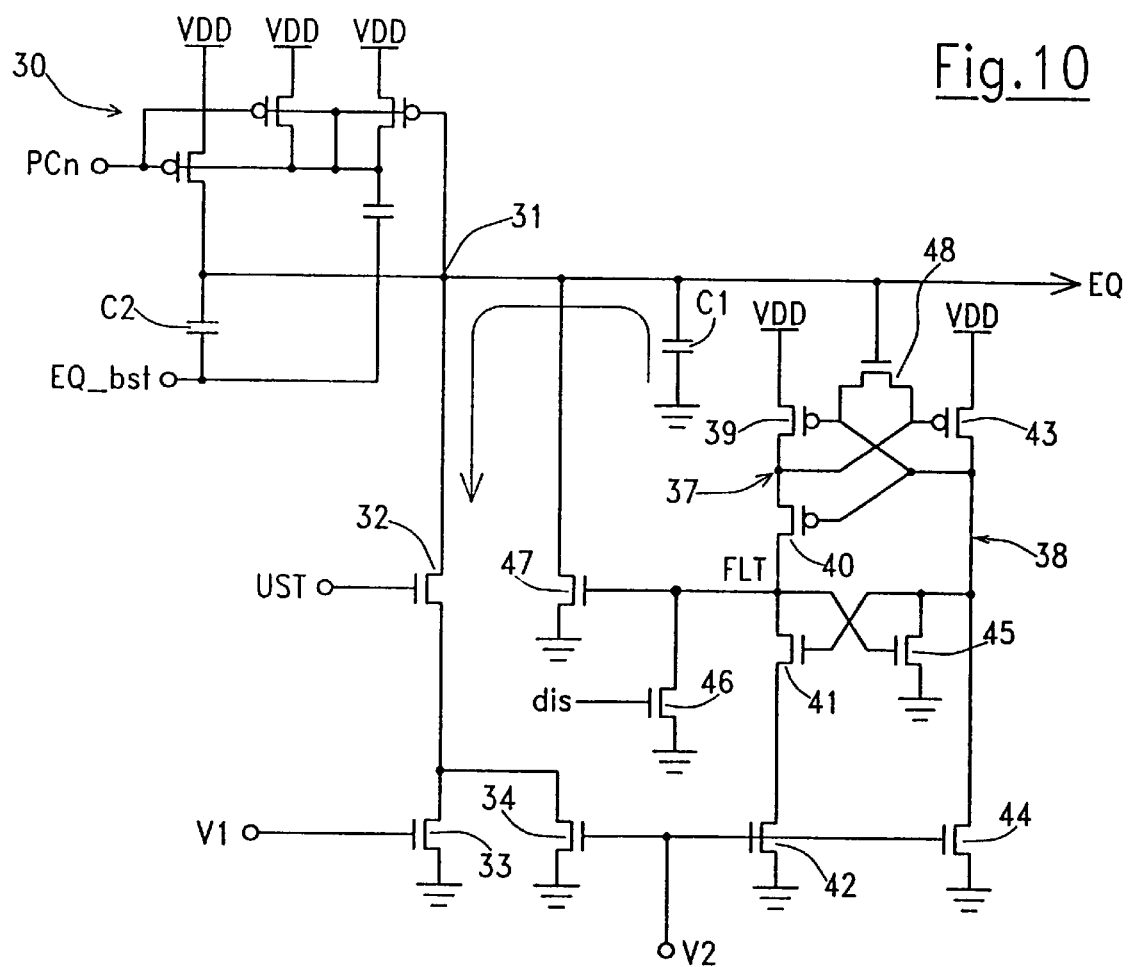
FIG. 10 is a circuit diagram of a fourth block of the circuit of FIG. 2.

FIG. 10 shows the circuit diagram of block 18 of the circuit in FIG. 2. The circuit comprises a voltage boosting network 30, controlled by signals PCn and EQ_bst, for generating a voltage higher than VDD at a node 31 to which signal EQ (the output of block 18) is connected. To node 31 there is connected a plate of a capacitor C1 whose other plate is connected to ground. To node 31 there is further connected a discharge circuit for capacitor C1 comprising an N-channel MOSFET 32, controlled by signal UST generated by block 14. An N-channel MOSFET 33 connected to the source of MOSFET 32 has source connected to ground and is driven by voltage V1. In parallel to MOSFET 33 there is connected an N-channel MOSFET 34 controlled by voltage V2.

The circuit further comprises a copy of the load circuit of the sensing circuit shown in FIG. 1, that is a circuit comprising two branches 37 and 38. Branch 37 comprises, connected in series between VDD and ground, a P-channel MOSFET 39, a P-channel MOSFET 40, an N-channel MOSFET 41 and an N-channel MOSFET 42; branch 38 comprises, connected in series between VDD and ground, a P-channel MOSFET 43 and an N-channel MOSFET 44. The gate of 43 is connected to the drain of 39, and similarly the gate of 39 is connected to the drain of 43; the gate 40 is also connected to the drain of 43. The gate of 41 is connected to the drain of 43; an N-channel MOSFET 45 is inserted between the drain of 43 and ground and has the gate connected to the drain of 40. The gates of 42 and 44 are controlled by signal 16. Between the drain of 40 and ground there is inserted an N-channel MOSFET 46 controlled by signal dis. The drain of 40 further controls an N-channel MOSFET 47 inserted between node 31 and ground. Between the gates of 39 and 43 there is further inserted an N-channel MOSFET 48 whose gate is controlled by the output signal EQ.

Figure 11:
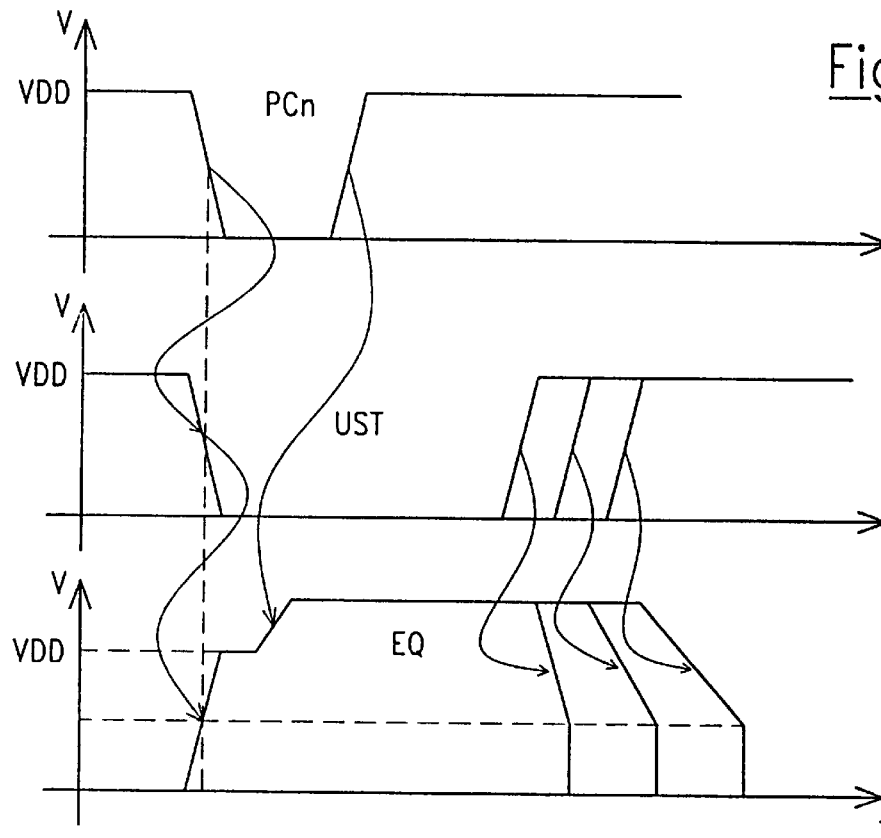
FIG. 11 shows the time evolution of some signals of the circuit of FIG. 10.

The operation of the circuit shown in FIG. 10 will be now described making reference to the timing diagrams of FIG. 11. When at the beginning of a read operation signal PCn goes to the "0" logic level, also signal EQ_bst goes to "0"; a boost capacitor C2 having one plate connected to node 31 and the other plate connected to signal EQ_bst charges up to VDD. Signal UST goes to "0", turning MOSFET 32 off and thus disabling the discharge path of capacitor C1. When signal PCn returns to "1", after a certain delay also signal EQ_bst returns to "1" and the potential of node 31 rises beyond VDD. In this way MOSFET 12 in the sensing circuit is driven by a gate voltage higher than VDD and assures a good short-circuit between nodes O and ON; if differently MOSFET 12 were driven by voltage VDD, due to the body effect and the high working point of nodes O and ON, the short-circuit between nodes O and ON could not be guaranteed. Similar reasoning holds true for the structure which in block 18 is a copy of the load circuit of the sensing circuit, in connection with MOSFET 48 and nodes 37 and 38. Furthermore, signal dis, which went to "1" after signal PCn has switched to "0", turns MOSFET 46 on and thus MOSFET 467 is kept off.

After a time interval which, as previously described, depends on the characteristics of the memory cells, signal UST goes to "1" turning MOSFET 32 on and thus enabling the discharge path of capacitor C1. The discharge of C1 takes place through MOSFETs 33 and 34, biased by voltages V1 and V2; the discharge of C1 takes place at a constant current which depends on current I sunk by the sample memory cell 1' and thus on the characteristics of the memory cells. As potential of node 31 falls, MOSFET 48 which equalizes the gate potentials of MOSFETs 39 and 43 begins to turn off. As long as 48 keeps the gates of 39 and 40 short-circuited, since the drain potentials of 39 and 43 set at approximately one threshold below VDD, MOSFET 40 is off and no current flows in branch 37. As 48 turns off, the short-circuit between the gates of 39 and 43 becomes less effective, MOSFET 40 begins to turn on and a current starts flowing in branch 37 having a value depending on voltage V2 applied to the gate of 42. It should be noted that, by construction, nodes 37 and 38 take the same potentials of nodes O and ON of the sensing circuit. The potential of node 38 falls with respect to the potential of node 37 due to the decoupling action of MOSFET 40. The potential of node FLT rises because with the fall of the potential of node 38 and the simultaneous rise of the potential of node 37 MOSFET 40 turns on; the feed-back of node FLT on MOSFET 45 speeds up the fall of the potential of node 38. Before FLT reaches the threshold of 47, the potential of signal EQ falls linearly with a slope depending on the discharge current of capacitor C1, i.e. on the voltage value of signals 15 and 16 (i.e. on the characteristics of the memory cells).

When the potential of node FLT reaches the threshold of 47, this latter turns on and signal EQ is quickly brought to ground. The change in slope of the falling edge of signal EQ starts when the difference in potentials between nodes 37 and 38 is equal to the threshold of MOSFET 40; this reproduces the condition in the sensing circuit that the potential difference between nodes O and ON is sufficient to assure a correct reading of the datum.

In this way signal EQ not only has a duration not fixed but varying according to the characteristics of the memory cells, but signal EQ also has a falling edge which, at least at the beginning, has a slope not fixed but varying according to the characteristics of the memory cells.

If the conductivity of the sample memory cell 1' is so low that voltage V1 does not reach the threshold voltage of MOSFET 25 in FIG. 8, signal UST remains at the low logic level; consequently, in the circuit of FIG. 10 capacitor C1 cannot discharge and signal EQ remains at the high logic level indefinitely; the sensing circuit is thus left in the equalization condition and the sensing phase of the datum never starts. This is desirable because a too low conductivity of the memory cells means that the working conditions do not guarantee a reliable reading.

Figure 12:
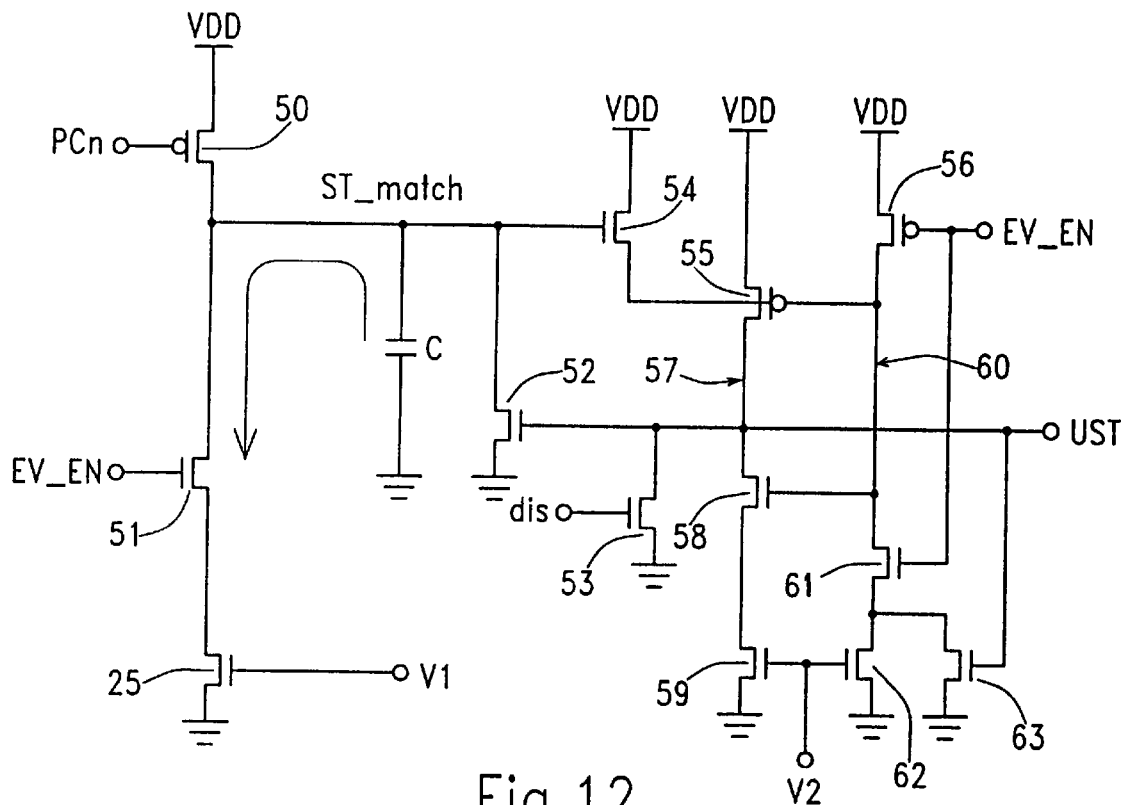
FIG. 12 is a circuit diagram of a second embodiment of the third block of the circuit of FIG. 2.

FIG. 12 is a circuit diagram of a second embodiment of block 14 of the circuit shown in FIG. 2. The circuit comprises a P-channel MOSFET 50 driven by signal PCn with source connected to VDD and drain connected to one plate of a capacitor C whose other plate is connected to ground. In series to the drain of 50 there is connected a discharge circuit for the capacitor comprising an N-channel MOSFET 51 driven by signal EV_EN generated by block 13 and enabling the discharge path; as in the case of FIG. 8, the discharge circuit comprises an N-channel MOSFET 25 controlled by voltage V1.

Between node ST_match and ground there is inserted an N-channel MOSFET 52 with gate connected to the drain of an N-channel MOSFET 53 controlled by signal dis. Node ST_match also controls an N-channel MOSFET 54 with drain connected to VDD and source connected to the gate of a P-channel MOSFET 55 and to the drain of a P-channel MOSFET 56. MOSFET 55 belongs to a circuit branch 57 inserted in series between VDD and ground and comprising, in series to 55, two N-channel MOSFETs 58 and 59, the latter driven by voltage V2. The common node between 55 and 58 forms signal UST. MOSFET 56 belongs to a circuit branch 60 inserted in series between VDD and ground and further comprising, in series to 56, two N-channel MOSFETs 61 and 62, the former controlled by signal EV_EN and the latter driven by voltage V2. In parallel to MOSFET 62 an N-channel MOSFET 63 is further connected, driven by signal UST.

When signal PCn goes to "0" 50 turns on; simultaneously also signal EV_EN goes to "0" turning 51 off and disabling the discharge path. In this way, capacitor C charges up to VDD. As long as PCn remains low, signal dis is "1", 53 is on and 52 is off; signal UST is kept to "0". Additionally, EV_EN keeps 56 on and 61 off, so that the gate of 55 is "1" and the source of 54 is at VDD.

When PCn returns to "1", 50 turns off. After a short delay EV_EN returns to "1" and 51 turns on, enabling the discharge circuit of capacitor C which thus discharges at a constant current through 25. When signal dis returns to "0" 53 is turned off, so that 52 is controlled only by the potential of the common node between 55 and 58. Signal EV_EN also turns 56 off and turns 61 on; a current starts flowing in branch 60 coming from VDD through 54. The gate potential of 55 starts falling turning 55 on, so that a current starts flowing in branch 57 too. With the discharge of capacitor C signal ST_match falls turning 54 off. The gate potential of 55 falls turning 55 more on, and the gate potential of 52 rises. This contributes to the discharge of C. When the gate potential of 52 becomes sufficiently high, the discharge of C becomes fast, 54 is completely turned off and signal UST quickly switches to "1".

Thus, differently from the circuit of FIG. 8, in this circuit the discharge of C does not go on at constant current till the complete discharge, but from a certain instant on the discharge becomes fast. This varied discharge avoids unnecessary delays and problems related to disturbances on the voltage supply VDD and ground.

Figure 13:
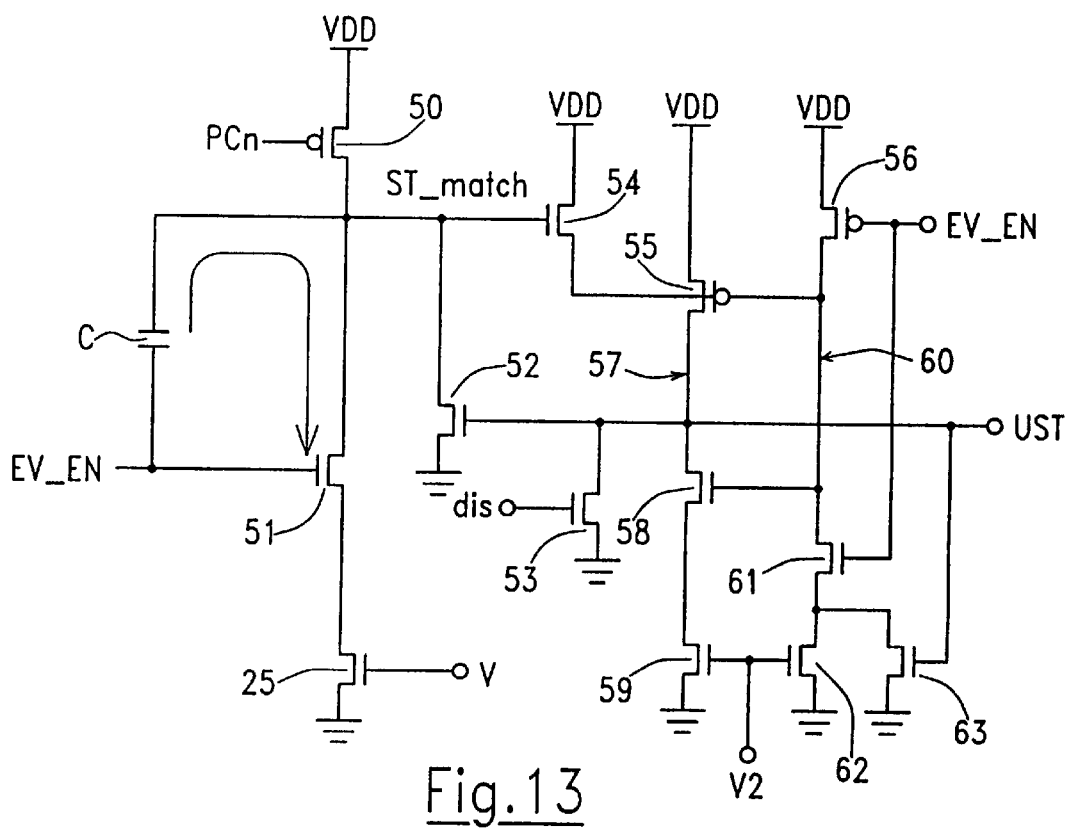
FIG. 13 is a circuit diagram of a third embodiment of the third block of the circuit of FIG. 2.

FIG. 13 shows a third embodiment of block 14 of FIG. 2. This circuit is substantially identical to that of FIG. 12, with the only difference that capacitor C has one plate connected to signal EV_EN, instead of ground. In this way signal ST_match is boosted and can reach a potential higher than VDD. MOSFET 55 turns on only after a given delay from the start of the discharge of C. This prevents a situation in which, due to a premature turning on of MOSFET 55, the constant-current discharge of capacitor C stops prematurely and signal UST is consequently activated prematurely.

Figure 14:
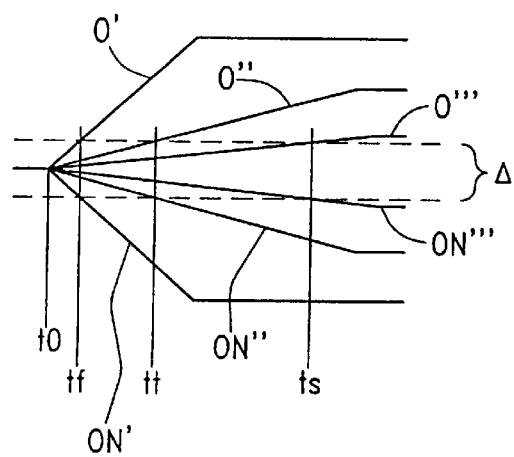
FIG. 14 schematically shows the principle of operation of the circuit of FIG. 2.

FIG. 14 schematically shows the principle of operation of the circuit of FIG. 2. Δ is a voltage range for the potentials of nodes O and ON of the sensing circuit of FIG. 1 within which the sensing circuit cannot operate correctly, because the potential difference between nodes O and ON is too small. Instant t0 is the instant at which signal PCn is deactivated. The pairs of curves O' and ON', O" and ON", and O'" and ON'" show the evolution of the potentials of nodes O and ON in three different cases of conductivity of the memory cells 1. In the first case (curves O' and ON') the cells are highly conductive and sunk a high current; nodes O and ON unbalance quickly and the datum is read at instant tf (deactivation of signal EQ). In the second case (curves O" and ON") the memory cells have a lower conductivity and the datum is read at a later instant tt. In the third case (curves O'" and ON'") the conductivity of the memory cells is very low and the datum is read at instant ts.

I claim:

1. A circuit to generate initialization signals for a memory cell sensing circuit, the sensing circuit comprising initialization means activated by the initialization signals during an initial phase of a sensing operation of memory cells, the initialization signals having a variable time duration based on a conductivity of the memory cells, such that a duration of the initial phase of the sensing operation depends on the conductivity of the memory cells.

2. The circuit according to claim 1, wherein the variable time duration of the initialization signals is inversely proportional to the conductivity of the memory cells.

3. The circuit according to claim 2, wherein the variable time duration of the initialization signals is indefinitely long when the conductivity of the memory cells is lower than a first prescribed value, such that the circuit to generate the initialization signals maintains the sensing circuit in the initial phase.

4. A circuit to generate initialization signals for a memory cell sensing circuit, the sensing circuit comprising initialization means activated by the initialization signals during an initial phase of a sensing operation of memory cells, the initialization signals having a variable time duration inversely proportional to a conductivity of the memory cells such that a duration of the initial phase of the sensing operation depends on the conductivity of the memory cells, wherein the variable time duration of the initialization signals is indefinitely long when the conductivity of the memory cells is lower than a first prescribed value, such that the circuit to generate the initialization signals maintains the sensing circuit in the initial phase, the circuit to generate the initialization signals comprising;

first circuit means for determining said conductivity of the memory cells; and second circuit means controlled by said first circuit means for generating said initialization signals.

5. The circuit according to claim 4, wherein said first circuit means generates at least one voltage signal based on the conductivity of the memory cells.

6. The circuit according to claim 5, wherein said at least one voltage signal increases substantially linearly with an increase of the conductivity of the memory cells.

7. The circuit according to claim 6, wherein said at least one voltage signal increases with an increase of a supply voltage of the sensing circuit.

8. The circuit according to claim 7, wherein the variable time duration of said initialization signals decreases with the increase of the supply voltage, so as to modulate the duration of the initial phase of the sensing operation based on the voltage.

9. The circuit according to claim 8, wherein said first circuit means comprises setting means for varying a degree of dependence of said at least one voltage signal on the conductivity of the memory cells.

10. The circuit according to claim 9, wherein said second circuit means comprises:

a timing circuit to generate, at a beginning of the sensing operation, a first timing signal having a constant time duration; and a modulation circuit controlled by said first circuit means to activate said initialization signals in response to the first timing signal and to modulate the variable time duration of said initialization signals based on the conductivity of the memory cells and the first timing signal.

11. The circuit according to claim 10, wherein said modulation circuit comprises:

a first circuit supplied by said first timing signal and controlled by said first circuit means to generate a second timing signal activated in response to the first timing signal and having the variable time duration; and a second circuit supplied by said second timing signal and controlled by said first circuit means to generate said initialization signals based on the second timing signal, the initialization signals having a variable deactivation edge slope based on the conductivity of the memory cells.

12. The circuit according to claim 11, wherein said first circuit comprises:

a first ramp signal generator activated by the first timing signal and controlled by said first circuit means to generate a first ramp signal having a first variable slope based on the conductivity of the memory cells; and a first level detector circuit to activate said second timing signal upon an activation of the first timing signal and to deactivate the second timing signal when said first ramp signal reaches a prescribed threshold level, such that the variable time duration depends on the first variable slope.

13. The circuit according to claim 12, wherein said first ramp signal generator comprises:
a first capacitor;
first charge means for charging the first capacitor, the first charge means being activated by the first timing signal; and
first constant-current discharge means for discharging the first capacitor, the first constant-current discharge means being activated at an end of the first timing signal and controlled by the first circuit means to determine a first constant discharge current of the first capacitor, the first discharge current being dependent on the conductivity of the memory cells.

14. The circuit according to claim 13, wherein said first constant-current discharge means comprises:
a transistor to discharge the first capacitor at the end of the first timing signal; and
a discharge transistor biased by said at least one voltage signal generated by the first circuit means so as to determine the first constant discharge current.

15. The circuit according to claim 14, wherein said second circuit comprises a second ramp signal generator to generate a second ramp signal having the variable deactivation edge lope.

16. The circuit according to claim 15, wherein said second ramp signal generator comprises:
a second capacitor;
second charge means for charging the second capacitor, the second charge means being activated by the first timing signal; and
second constant-current discharge means for discharging the second capacitor, the second constant-current discharge means being activated at an end of the second timing signal and controlled by the first circuit means to determine a second constant discharge current of the second capacitor, the second discharge current depending on the conductivity of the memory cells.

17. The circuit according to claim 16, wherein said second constant-current discharge means comprises:
an enabling transistor controlled by the second timing signal and activated at the end of the second timing signal to discharge the second capacitor; and
a discharge transistor biased by said at least one voltage signal generated by the first circuit means.

18. The circuit according to claim 17, wherein said second circuit comprises a fast discharge circuit to rapidly discharge said second capacitor, the fast discharge circuit activated automatically during a deactivation of the initialization signals when the initialization signals reach a second prescribed value, to determine a final fast deactivation of said initialization signals.

19. The circuit according to claim 18, wherein said fast discharge circuit comprises an additional circuit substantially identical to the sensing circuit to determine said second prescribed value, so that said final fast deactivation of the initialization signals is activated when the duration of said initial phase is sufficiently long to assure a correct reading of the memory cells.

20. The circuit according to claim 19, wherein said second charge means comprises voltage boosting means to charge the second capacitor up to a boost voltage higher than the supply voltage.

21. A memory cell sensing circuit, comprising:
an initialization circuit, activated by at least one initialization signal during an initial phase of a sensing operation of a memory cell, to initialize the sensing circuit;
a first circuit to determine a conductivity of the memory cell; and
a second circuit controlled by said first circuit to generate the at least one initialization signal, said at least one initialization signal having a time duration based on the conductivity of said memory cell, such that a duration of said initial phase of the sensing operation depends on the conductivity of the memory cell.

22. The circuit according to claim 21, wherein said time duration of said at least one initialization signal is inversely proportional to said conductivity of the memory cell.

23. The circuit according to claim 22, wherein said time duration of the initialization signal is indefinitely long when said conductivity of the memory cell is lower than a first predetermined value, such that the second circuit maintains the sensing circuit in the initial phase.

24. The circuit according to claim 23, wherein said first circuit generates at least one voltage signal based on the conductivity of the memory cell.

25. The circuit according to claim 24, wherein said at least one voltage signal increases substantially linearly with an increase of the conductivity of the memory cell.

26. The circuit according to claim 25, wherein said at least one voltage signal increases with an increase of a supply voltage of the sensing circuit.

27. The circuit according to claim 26, wherein the time duration of said at least one initialization signal decreases with the increase of the supply voltage, so as to modulate the duration of the initial phase of the sensing operation based on the supply voltage.

28. The circuit according to claim 27, wherein said first circuit comprises a setting circuit to vary a degree of dependence of said at least one voltage signal on the conductivity of the memory cell.

29. The circuit according to claim 28, wherein said second circuit comprises:
a timing circuit to generate, at a beginning of the sensing operation, a first timing signal having a constant time duration; and
a modulation circuit controlled by said first circuit to activate said at least one initialization signal in response to the first timing signal and to modulate the time duration of said at least one initialization signal based on the conductivity of the memory cell.

30. The circuit according to claim 29, wherein said modulation circuit comprises:
a first circuit supplied by said first timing signal and controlled by said first circuit means to generate a second timing signal activated in response to the first timing signal and having the time duration; and
a second circuit supplied by said second timing signal and controlled by said first circuit means to generate said at least one initialization signal based on the second timing signal, the at least one initialization signal having a variable deactivation edge slope based on the conductivity of the memory cell.

31. The circuit according to claim 30, wherein said first circuit comprises:
a first ramp signal generator activated by the first timing signal and controlled by said first circuit means to generate a first ramp signal having a first variable slope based on the conductivity of the memory cell; and a first level detector circuit to activate said second timing signal upon an activation of the first timing signal and to deactivate the second timing signal when said first ramp signal reaches a prescribed threshold level, such that the time duration depends on the first variable slope.

32. The circuit according to claim 31, wherein said first ramp signal generator comprises:

a first capacitor;

first charge means for charging the first capacitor, the first charge means being activated by the first timing signal; and first constant-current discharge means for discharging the first capacitor, the first constant-current discharge means being activated at an end of the first timing signal and controlled by the first circuit to determine a first constant discharge current of the first capacitor, the first discharge current being dependent on the conductivity of the memory cells.

33. The circuit according to claim 32, wherein said first constant-current discharge means comprises:

a transistor to discharge the first capacitor at the end of the first timing signal; and a discharge transistor biased by said at least one voltage signal generated by the first circuit so as to determine the first constant discharge current.

34. The circuit according to claim 33, wherein said second circuit comprises a second ramp signal generator to generate a second ramp signal having the variable deactivation edge slope.

35. The circuit according to claim 34, wherein said second ramp signal comprises:

a second capacitor;

second charge means for charging the second capacitor, the second charge means being activated by the first timing signal; and second constant-current discharge means for discharging the second capacitor, the second constant-current discharge means being activated at an end of the second timing signal and controlled by the first circuit to determine a second constant discharge current of the second capacitor, the second discharge current depending on the conductivity of the memory cell.

36. The circuit according to claim 35, wherein said second constant-current discharge means comprises:

an enabling transistor controlled by the second timing signal and activated at the end of the second timing signal to discharge the second capacitor; and a discharge transistor biased by said at least one voltage signal generated by the first circuit.

37. The circuit according to claim 36, wherein said second circuit comprises a fast discharge circuit to rapidly discharge said second capacitor, the fast discharge circuit activated automatically during a deactivation of the at least one initialization signal when the at least one initialization signal reaches a prescribed value, to determine a final fast deactivation of said initialization signal.

38. The circuit according to claim 37, wherein said fast discharge circuit comprises an additional circuit substantially identical to the sensing circuit to determine said prescribed value, so that said final fast deactivation of the initialization signal is activated when the duration of said initial phase is sufficiently long to assure a correct reading of the memory cell.

39. The circuit according to claim 38, wherein said second charge means comprises voltage boosting means to charge the second capacitor up to a boost voltage higher than the supply voltage.

40. A method for generating at least one initialization signal for a memory cell sensing circuit, comprising steps of:

determining a conductivity level of a memory cell;

generating said at least one initialization signal, such that the at least one initialization signal has a timed duration based on the conductivity of said memory cell.

41. The method according to claim 40, wherein the step of generating includes a step of generating the at least one initialization signal such that the timed duration is inversely proportional to the conductivity of the memory cell.

42. The method according to claim 41, wherein the step of generating includes a step of generating the at least one initialization signal such that the timed duration is indefinitely long when the conductivity of the memory cell is lower than a predetermined value.

43. The method according to claim 40, wherein the step of determining the conductivity of the memory cell includes a step of generating at least one voltage signal depending on the conductivity of the memory cell.

44. The method according to claim 43, wherein the step of generating the at least one voltage signal includes a step of generating said at least one voltage signal such that the at least one voltage signal increases substantially linearly with an increase of the conductivity of the memory cell.

45. The method according to claim 44, wherein the step of generating the at least one voltage signals includes a step of generating said at least one voltage signal such that the at least one voltage signal increases with an increase of a supply voltage of the sensing circuit.

46. The method according to claim 45, wherein the step of generating the at least one initialization signal includes a step of decreasing the timed duration of said at least one initialization signal with the increase of the supply voltage.

* * * * *

UNITED STATES PATENT AND TRADEMARK OFFICE
CERTIFICATE OF CORRECTION

PATENT NO. : 5,914,901
DATED : June 22, 1999
INVENTOR(S): Luigi Pascucci

It is certified that error appears in the above-identified patent and that said Letters Patent is hereby corrected as shown below:

Col. 2, line 45, should read: "Fig. 2 is a block diagram of the circuit for generating a".

Col. 5, line 43, should read: "Vboost which, in memory devices is supplied with 5 V"

Col. 5, line 62, should read: "N-channel MOSFET M6. The gate of M6 is connected to".

Col. 5, line 65, should read: "MOSFET M8. M7 has its gate connected through a switch S1".

Col. 6, line 2, should read: "and the reference voltage. Similarly, M8 has its gate tied to the".

Col. 6, line 43, should read: "where K1 and K4 are coefficients depending on the aspect".

Col. 7, line 43, should read: "absolute value), having its source connected to V1, drain con-"

Col. 8, line 64, should read: "source of MOSFET 32 has its source connected to ground and".

UNITED STATES PATENT AND TRADEMARK OFFICE
CERTIFICATE OF CORRECTION

PATENT NO. : 5,914,901
DATED : June 22, 1999
INVENTOR(S) : Luigi Pascucci

It is certified that error appears in the above-identified patent and that said Letters Patent is hereby corrected as shown below:

Col. 9, line 43, should read:   FET 47 is kept off.".

Signed and Sealed this

Eleventh Day of January, 2000

Attest:

Q. TODD DICKINSON

Attesting Officer    Acting Commissioner of Patents and Trademarks